United States Patent
Sommers

(10) Patent No.: US 6,773,139 B2
(45) Date of Patent: Aug. 10, 2004

(54) VARIABLE OPTICS SPOT MODULE

(75) Inventor: Matthew Sommers, Sagamore Hill, OH (US)

(73) Assignee: GELcore LLP, Valley View, OH (US)

( * ) Notice: Subject to any disclaimer, the term of this patent is extended or adjusted under 35 U.S.C. 154(b) by 0 days.

(21) Appl. No.: 09/682,535

(22) Filed: Sep. 17, 2001

(65) Prior Publication Data

US 2003/0053310 A1 Mar. 20, 2003

(51) Int. Cl.[7] .............................................. F21V 5/00
(52) U.S. Cl. ...................... 362/237; 362/240; 362/242; 362/244; 362/231
(58) Field of Search ................................ 362/236, 237, 362/231, 240, 800, 332, 335, 336, 522, 242, 244, 241, 249

(56) References Cited

U.S. PATENT DOCUMENTS

| 4,214,168 | A | * | 7/1980 | Kulka .......................... 362/311 |
| 4,345,308 | A | * | 8/1982 | Mouyard et al. ............. 362/246 |
| 5,143,443 | A | * | 9/1992 | Madsen ........................ 362/255 |
| 5,174,649 | A | * | 12/1992 | Alston .......................... 362/244 |
| 5,477,436 | A | * | 12/1995 | Bertling et al. .............. 362/231 |
| 5,580,163 | A | | 12/1996 | Johnson, II |
| 5,636,057 | A | * | 6/1997 | Dick et al. ................... 359/625 |
| 5,779,351 | A | * | 7/1998 | Erickson et al. ............. 362/241 |
| 5,806,969 | A | * | 9/1998 | Rosengren ................... 362/235 |
| 5,833,355 | A | * | 11/1998 | You et al. .................... 362/244 |
| 6,033,087 | A | | 3/2000 | Shozo et al. |
| 6,038,005 | A | * | 3/2000 | Handschy et al. ........... 362/246 |
| 6,227,679 | B1 | | 5/2001 | Zhang et al. |
| 6,244,727 | B1 | * | 6/2001 | Ryan, Jr. et al. ............. 362/244 |
| 6,250,774 | B1 | * | 6/2001 | Begemann et al. .......... 362/231 |
| 6,340,868 | B1 | * | 1/2002 | Lys et al. ................. 315/185 S |
| 6,443,594 | B1 | * | 9/2002 | Marshall et al. ............. 362/244 |
| 2002/0181231 | A1 | * | 12/2002 | Luk ............................ 362/240 |

FOREIGN PATENT DOCUMENTS

EP          1 072 884 A2     1/2001

* cited by examiner

Primary Examiner—Thomas M. Sember
(74) Attorney, Agent, or Firm—Fay, Sharpe, Fagan, Minnich & McKee, LLP

(57) ABSTRACT

A lamp (10) includes a substrate (12), a first lighting unit (14A) and a second lighting unit (14B). The first lighting unit (14A) includes a first light emitting diode (22A) arranged on the substrate (12), and a first lens element (24A) that has a first optical prescription and is arranged to interact with light produced by the first light emitting diode (22A). The second lighting unit (14B) includes a second light emitting diode (22B) arranged on the substrate (12), and a second lens element (24B) that has a second optical prescription and is arranged to interact with light produced by the second light emitting diode (22B). A means (30) for selectively applying electrical power has at least a first selectable mode in which the means (30) applies power to the first lighting unit (14A) whereby a first light output pattern is emitted, and a second selectable mode in which the means (30) applies power to the second lighting unit (14B) whereby a second light output pattern is emitted.

12 Claims, 5 Drawing Sheets

VARIABLE OPTICS SPOT MODULE

BACKGROUND OF INVENTION

The invention relates to the lighting arts. It is especially applicable to the packaging of light emitting diodes (LED's) to form a spot light, flashlight, or other lamp type, and will be described with particular reference thereto. However, the invention will also find application in packaging of LED's, semiconductor lasers, halogen bulbs, and other light emitting elements for lighting and other optical applications.

Lighting systems are advantageously flexible in terms of the light output spatial pattern or angular distribution. Flashlights, work lights, spot lights, and other lighting systems preferably can emit light at different angular distributions, e.g. narrowthrough wide-beam. A desk lamp preferably is adjustable to light only the present work area thereby most efficiently using the light generated by the lamp. In the desk lamp case, the work area is often rectangular, and so the spatial pattern of the emitted light is preferably arranged to fill the rectangular work area at the desk surface.

The prior art includes limited control over the angular distribution of the light emitted by light sources such as incandescent light bulbs, halogen lamps, and light emitting diode-based light sources. Flashlights which have variable beam expanding optics are known. However, such flashlights typically provide only a single level of control, e.g. narrow circular beam versus wider circular beam. Halogen bulbs typically come with fixed prescriptions, e.g. the MR16 halogen bulb series that provides narrow angle, wide angle, and medium angle flood characteristics. In order to change the spatial characteristics of the light output in a lamp using such a fixed-prescription halogen bulb, it is usually necessary to physically replace the bulb.

In the above-cited prior art, the adjustment is limited to isotropic, i.e. circular adjustment of the angular distribution of the light beam. Desk lamps are also known that have rectangular reflector hoods, usually used in conjunction with tubular fluorescent lamps, that emit light with a non-circular distribution. However, the spatial distribution of the light output of such lamps is usually not adjustable.

The present invention contemplates an improved light source or lamp that overcomes the above-mentioned limitations and others.

SUMMARY OF INVENTION

In accordance with one embodiment of the present invention, a lamp is disclosed, that includes a substrate. A first lighting unit includes a first light emitting diode (LED) arranged on the substrate and a first lens element having a first optical prescription and being arranged to interact with light produced by the first LED. A second lighting unit includes a second light emitting diode (LED) arranged on the substrate and a second lens element having a second optical prescription and being arranged to interact with light produced by the second LED.

In accordance with another aspect of the present invention, a control unit applies operating power to at least one of the first lighting unit and the second lighting unit.

In accordance with another aspect of the present invention, a control unit has at least two selectable operational modes. A first selectable operational mode applies power to the first lighting unit. A second selectable operational mode applies power to the second lighting unit. Optionally, a third selectable operational mode applies power to both the first lighting unit and to the second lighting unit.

In accordance with another aspect of the present invention, the light emission from the first LED has a first spectral distribution, and the light emission from the second LED has a second spectral distribution that is different from the first spectral distribution.

In accordance with another aspect of the present invention, at least one of the first lens element and the second lens element includes a tinted region whereby the spectral distribution of the light emission of the at least one lighting unit that includes the tinted region is altered in a pre-selected manner by the tinted region.

In accordance with another embodiment of the present invention, a light source having a selectable light output is disclosed. A plurality of optical sources are arranged on a substrate. Each optical source includes a light emitting diode and an optical element in operative communication with the light emitting diode and having a pre-defined optical prescription. The plurality of optical sources are selectively operable to produce light having selected light output characteristics.

In accordance with another aspect of the present invention, the selective operation of the plurality of optical sources includes at least one of: selectively operating one of the plurality of optical sources; selectively operating a sub-set of the plurality of optical sources; and selectively operating all of the plurality of optical sources.

In accordance with another aspect of the present invention, the selected light output characteristics include selected spatial light output patterns.

In accordance with another aspect of the present invention, the selected light output characteristics include selected angular distributions of the emitted light. Optionally, the selected light output characteristics also include selected light colors.

In accordance with another aspect of the present invention, a control unit operates selected optical sources producing a spatial and angular distribution of the light source output. The control unit optionally also includes electrical circuitry that conditions the power applied to at least one of the first optical source and the second optical source In accordance with another aspect of the present invention, the optical element includes a first lens element formed according to the pre-defined optical prescription.

In accordance with yet another aspect of the present invention, in an LED light source comprising a plurality of light emitting diodes disposed on a substrate each in optical communication with a lens, a method of varying light patterns produced by the LED light source is disclosed. A first set of the plurality of light emitting diodes is selected. Light emitting diodes in the first set of light emitting diodes are powered. Light emitted by each of the powered light emitting diodes in the first set passes through lenses integral with each of the powered light emitting diodes in the first set producing a first angular distribution of light. A second set of the plurality of light emitting diodes is selected. Light emitting diodes in the second set of light emitting diodes are powered. Light emitted by each of the powered light emitting diodes in the second set passes through lenses integral with each of the powered light emitting diodes in the second set producing a different angular distribution of light.

In accordance with another aspect of the present invention, the method further includes depowering at least selected light emitting diodes in the first set prior to powering the light emitting diodes in the second set.

In accordance with another aspect of the present invention, the method further includes altering a wavelength associated with the different angular distribution of light such that the different angular distribution of light comprises a color different than the first angular distribution of light.

Numerous advantages and benefits of the present invention will become apparent to those of ordinary skill in the art upon reading and understanding the following detailed description.

BRIEF DESCRIPTION OF DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION

Figure 1:
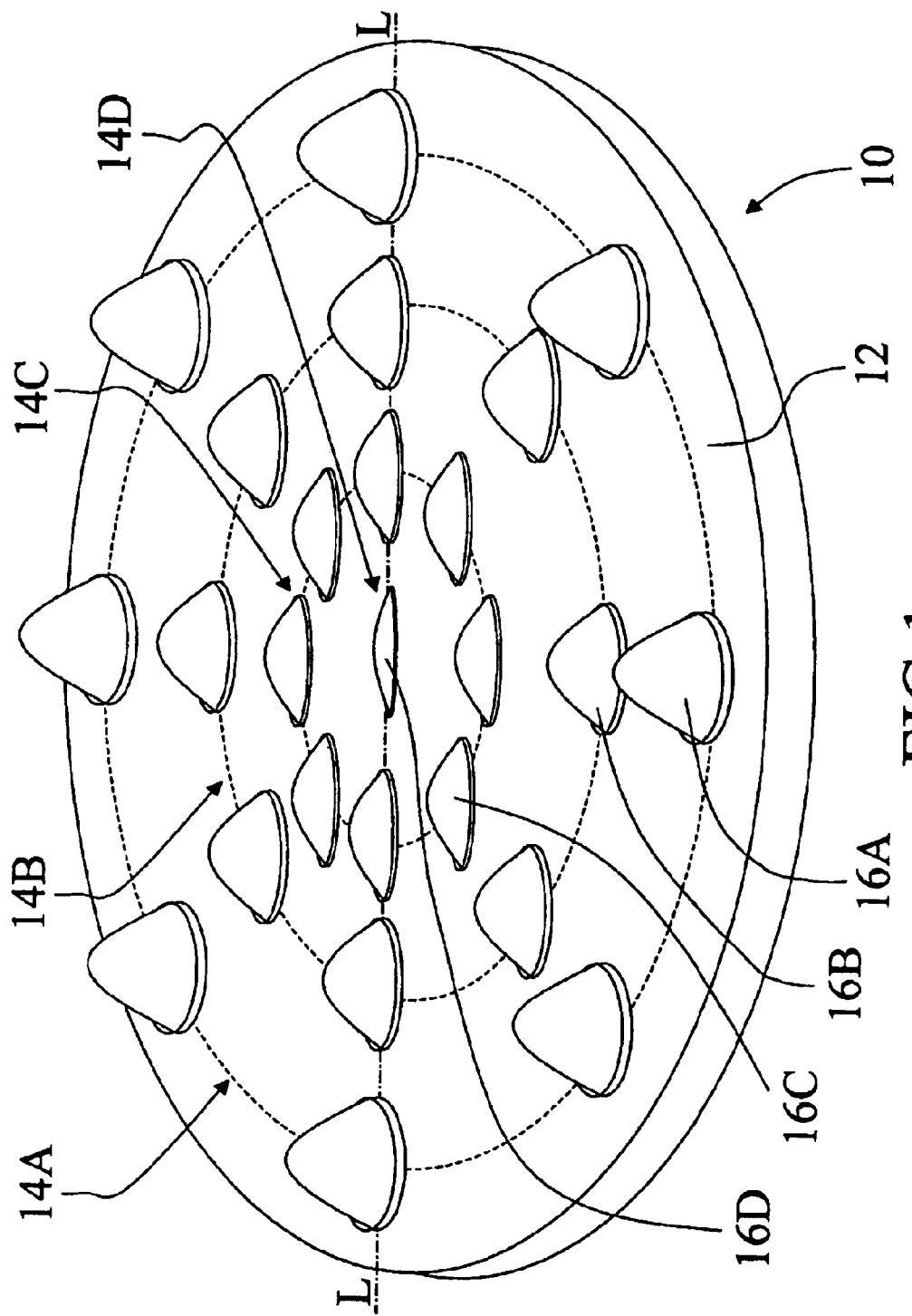
FIG. 1 shows a perspective view of a lamp or light source which suitably practices an embodiment of the invention.

With reference to FIG. 1, a first embodiment of the invention is described. A lamp or light source 10 includes a substrate 12 which in the embodiment of FIG. 1 is circular in shape. Arranged on the substrate 12 are a plurality of optical sources or lighting units 14A, 14B, 14C, 14D. Each of the lighting units or optical sources 14A, 14B, 14C, 14D include one or more light emitting diode (LED) components. The optical source 14A comprises eight LED components 16A. The optical source 14B comprises eight LED components 16B. The optical source 14C comprises eight LED components 16C. The optical source 14D comprises only a single LED component 16D. In the embodiment of FIG. 1, the lighting unit 14D that includes only a single LED component 16D is located at the center of the substrate 12. The lighting units 14C, 14B, and 14A are arranged in concentric circular patterns of increasing diameter, respectively, about the lighting unit 14D.

Figure 2:
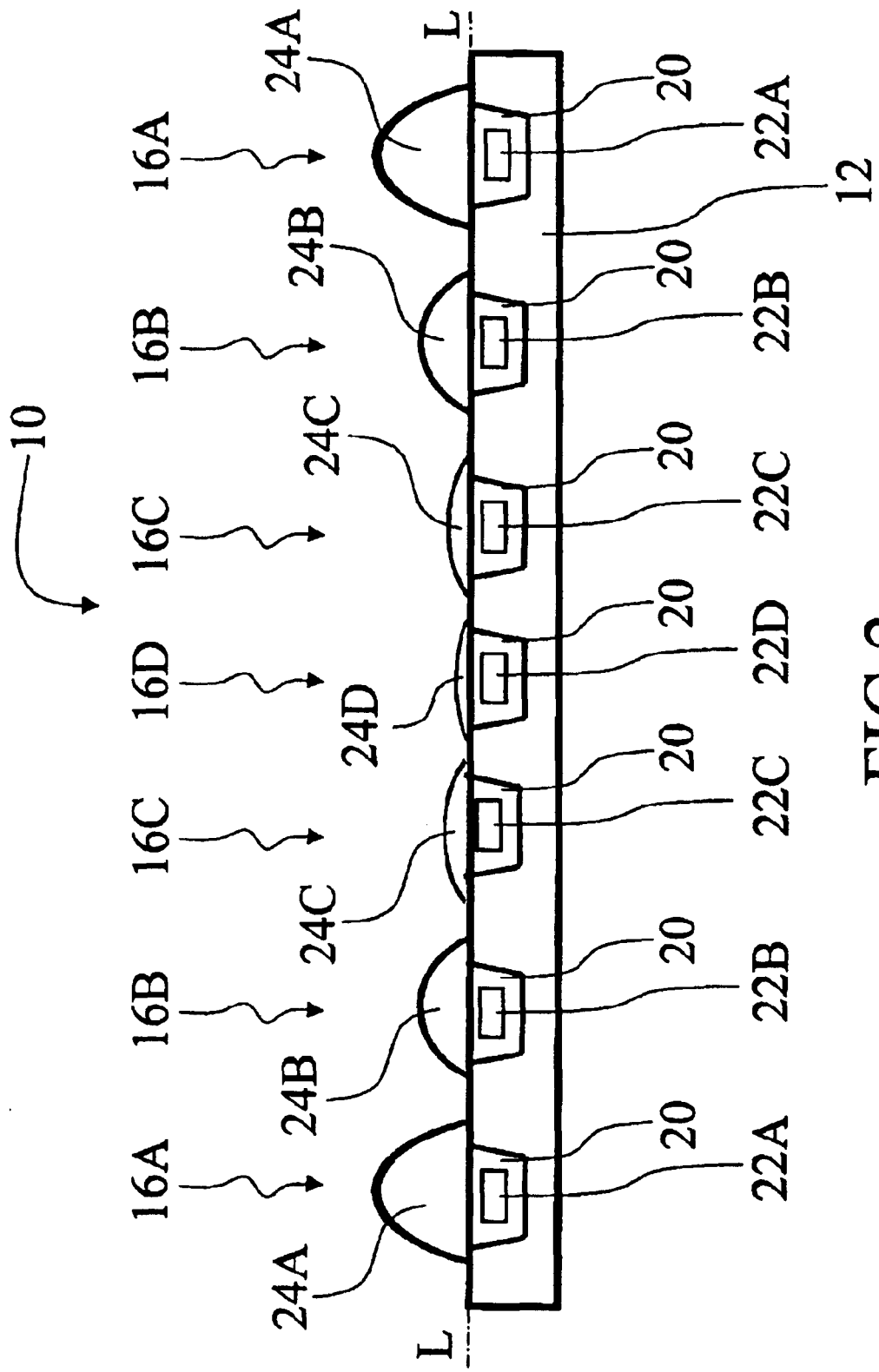
FIG. 2 shows a cross-sectional view of the lamp or light source of FIG. 1 taken perpendicular to the substrate along the Line L—L shown in FIG. 1.

With continuing reference to FIG. 1 and with further reference now to FIG. 2, an embodiment of the LED components 16A, 16B, 16C, 16D is described. FIG. 2 shows a cross-sectional view of the lamp or light source 10 taken perpendicular to the substrate 12 along the Line L—L shown in FIG. 1. A plurality of wells 20 are formed in the substrate 12 for receiving LED elements 22A, 22B, 22C, 22D that correspond to the LED components 16A, 16B, 16C, 16D, respectively. The substrate 10 is manufactured using a thermal heat sinking material such as a copper plate. Mounting of the LED elements and electrical contacting thereof are steps that are well known to the art and need not be described herein for an enabling disclosure.

It will be appreciated that the LED elements 22A, 22B, 22C, 22D need not be identical to one another, but can instead include LED elements emitting light at different colors or with different spectral distributions, different optical intensities, and the like. The LED elements 22A, 22B, 22C, 22D can be manufactured from different materials, e.g. LED element 22A can be a group III-nitride LED element emitting blue light, whereas LED element 22B can be a group III-phosphide LED element emitting red light. Furthermore, in the case of a plurality of LED elements comprising a lighting unit or optical source, e.g. the optical source 14A, every LED element of the plurality need not be identical. For simplicity, however, FIG. 2 shows all the LED elements 22A, 22B, 22C, 22D as being essentially identical.

The LED components 16A, 16B, 16C, 16D also include optical elements such as lenses 24A, 24B, 24C, 24D. In order to effectuate different angular distributions or spatial patterns for the light emitted by the lighting units 14A, 14B, 14C, 14D, the corresponding optical elements or lenses 24A, 24B, 24C, 24D each have different optical prescriptions. The lenses 24A, 24B, 24C, 24D can be discrete elements that are mounted above the wells 20. Alternatively, the optical elements 24A, 24B, 24C, 24D can be formed by controlled shaping or molding of an epoxy or resin encapsulant that is used to hermetically seal the LED elements 22A, 22B, 22C, 22D. In the illustrated embodiment of FIGS. 1 and 2, the different optical prescriptions are effectuated by different radii of the conic of the lenses or epoxy "bumps" 24A, 24B, 24C, 24D. Of course, other means for effectuating a preselected optical prescription can also be employed, such as by using different materials having different refractive indexes for each type of optical element 24A, 24B, 24C, 24D. It will also be appreciated that the optical elements 24A, 24B, 24C, 24D can, in addition to effectuating preselected optical prescriptions, also alter the light emitted by the optical sources 14A, 14B, 14C, 14D in other ways. For example, the optical elements or lenses 24A, 24B, 24C, 24D can be selectively tinted to alter the color or spectral distribution of the light passing therethrough in a preselected manner.

The embodiment illustrated in FIG. 2 is exemplary only. Other configurations for the LED components 16A, 16B, 16C, 16D and for the substrate 12 are also contemplated. For example, the substrate 12 can be a printed circuit board (PC board) with the LED elements 22A, 22B, 22C, 22D bonded directly thereto. The wells 20 would typically be omitted in this alternate embodiment.

Figure 3:
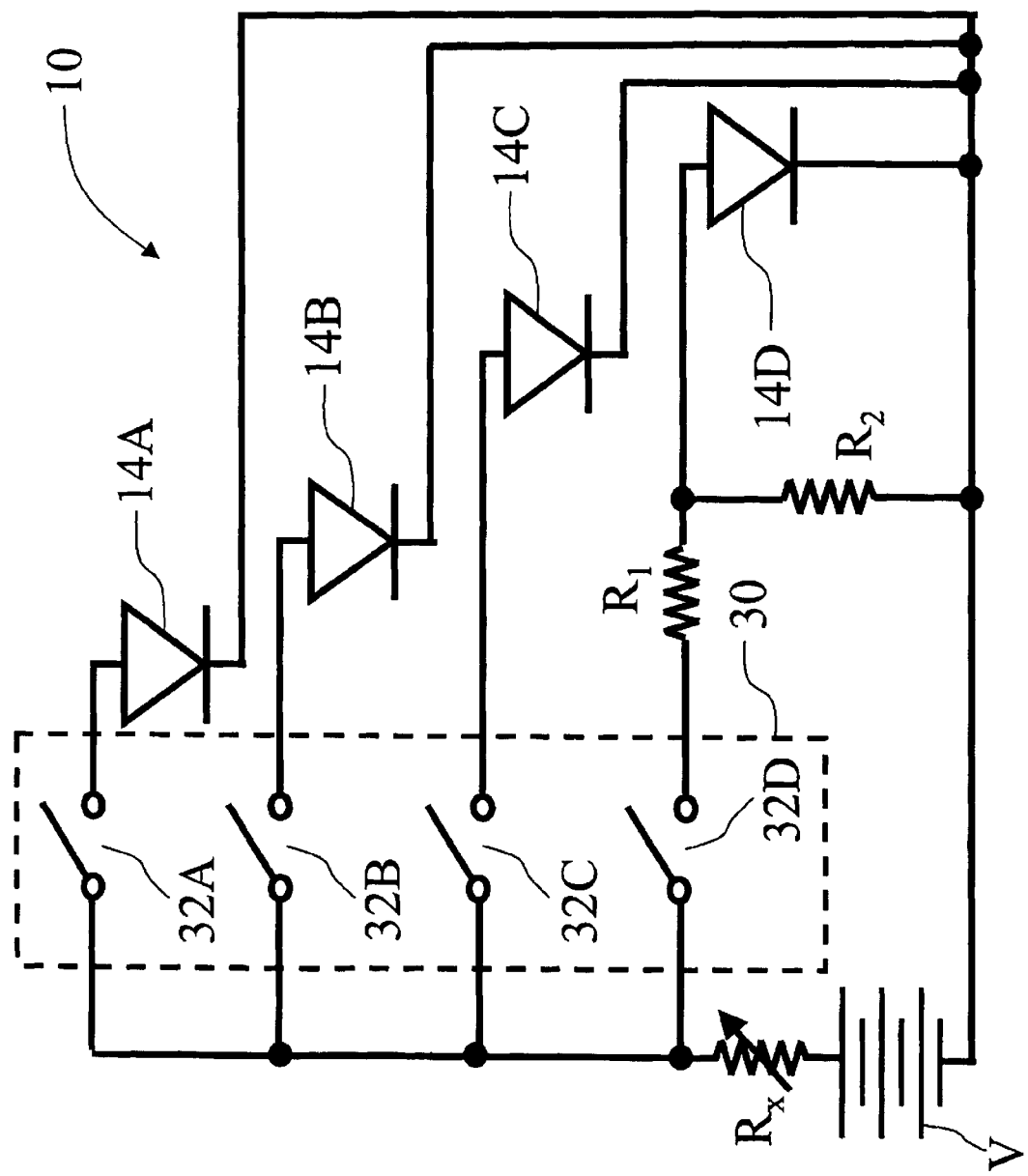
FIG. 3 shows an schematic representation of the electrical configuration of the lamp or light source of FIGS. 1 and 2.

With reference now to FIG. 3, the electrical configuration of the embodiment of FIGS. 1 and 2 is described. An associated voltage source V provides electrical power for the light source or lamp 10 that in the embodiment of FIGS. 1 and 3 includes four optical sources or lighting units 14A, 14B, 14C, 14D. The lamp 10 further includes a control unit 30 that has four switches 32A, 32B, 32C, 32D for selectively applying electrical power to the corresponding lighting units 14A, 14B, 14C, 14D. The switches 32A, 32B, 32C, 32D can be manual switches, electronically controlled switches, or other switch types. The control unit 30 optionally includes additional elements (not shown) such as a computer interface or components for conditioning the power applied to the lighting units. In the illustrated electrical configuration of FIG. 3, the four lighting units 14A, 14B, 14C, 14D are independently selectable, and any combination of the lighting units 14A, 14B, 14C, 14D can be selectively powered at any given time. Each of the lighting units 14A, 14B, 14C, 14D has a different optical prescription, obtained in the embodiment of FIGS. 1 and 2 by using different conic radii for the lenses 24A, 24B, 24C, 24D. Thus, by operating only a selected one of the four lighting units 14A, 14B, 14C, 14D four different angular distributions or spatial patterns of emitted light can be selectively obtained. By operating a selected sub-set of the plurality of optical sources 14A, 14B, 14C, 14D, complex combinations of the spatial light distributions of the individual optical sources 14A, 14B, 14C, 14D can be obtained. In a limiting operational case, all four optical sources 14A, 14B, 14C, 14D can be operated simultaneously using the electrical configuration shown in FIG. 3.

The electrical configuration of FIG. 3 is exemplary only, and a range of variations thereof are contemplated. As noted previously, the LED elements 22A, 22B, 22C, 22D can be of different types, e.g. GaN LED elements, InGaAIP LED elements, and so forth. In cases where the LED elements comprising the lighting units differ, the control unit 30 optionally includes voltage dividers or other power conditioning components that control the power applied to each optical source 14A, 14B, 14C, 14D. For example, in FIG. 3 a voltage divider including resistances $R_1$ and $R_2$ conditions power applied to the optical source 14D. Furthermore, as noted previously a given optical source, e.g. optical source 14A, can include LED elements of different types. In this case, the optical source 14A would itself include one or more electrical components (not shown) such as voltage dividers that condition the voltage applied to each LED element within the optical source 14A. In yet another variant, the control unit 30 includes a rheostat $R_x$, variable voltage divider, or other electrical component that enables variable power application to the lamp 10 as a whole or to one or more of the individual lighting units 14A, 14B, 14C, 14D that are included in the lamp 10. Such an arrangement advantageously enables the user to control the optical intensity as well as the spatial distribution of the light output.

Figure 4:
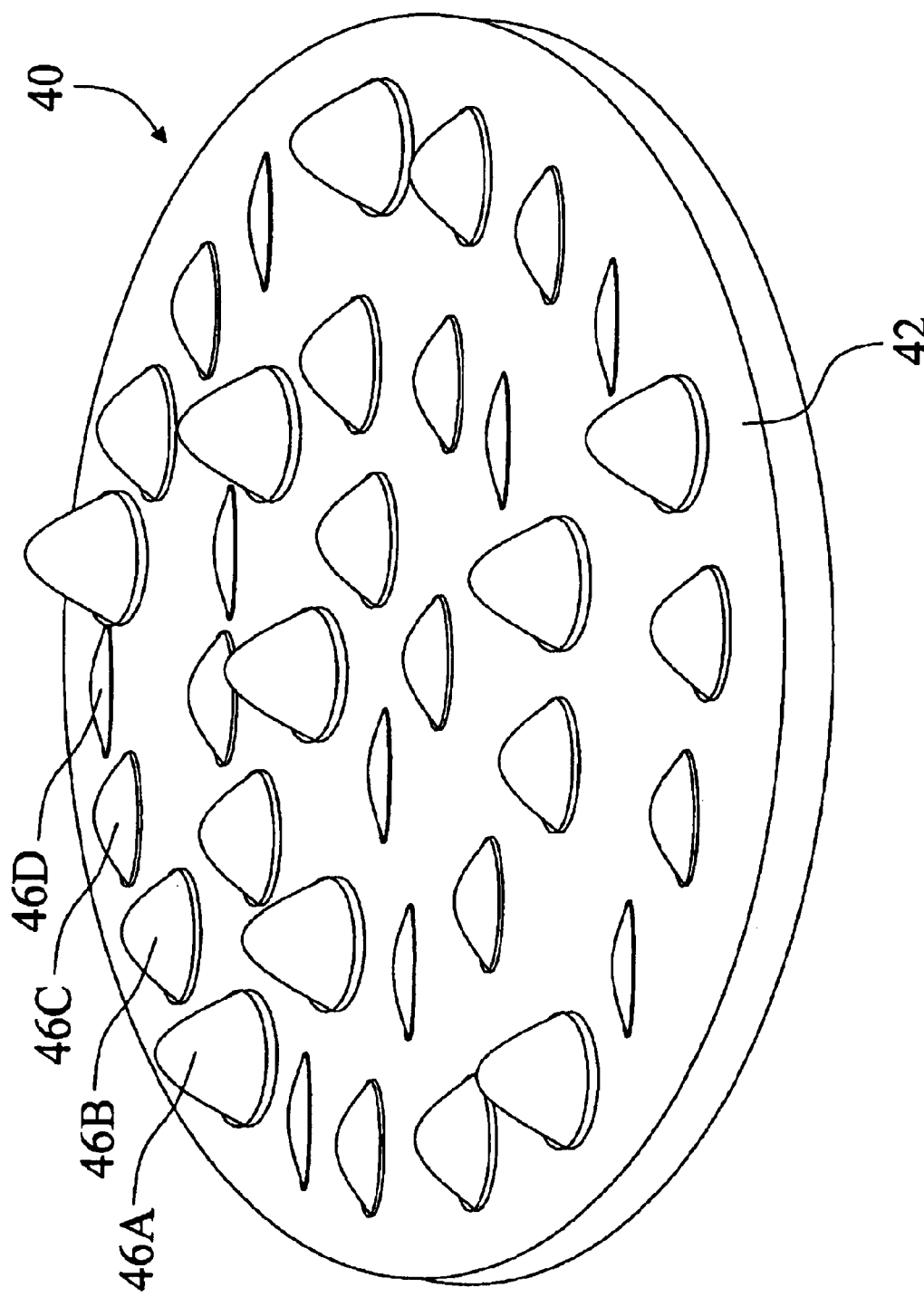
FIG. 4 shows a perspective view of a lamp or light source which suitably practices a second embodiment of the invention.

With reference now to FIG. 4, a second embodiment 40 of the invention is described. A circular substrate 42 has four lighting units arranged thereon. Each lighting unit includes a plurality of essentially identical LED components. The LED components of each lighting unit differ from the LED components of the other three lighting units. Hence, there are four LED component types 46A, 46B, 46C, 46D arranged on the substrate 42, corresponding to the four lighting units. Unlike the embodiment of FIG. 1, the embodiment of FIG. 4 has an equal number of LED components of each type, and the distribution of the LED component types 46A, 46B, 46C, 46D across the substrate 42 is essentially uniform. Although the spatial distribution of the LED component types is uniform, the lamp 40 nonetheless is capable of producing light having at least four selectable spatial or angular distributions because each of the four LED component types 46A, 46B, 46C, 46D has a different optical prescription, as indicated by the different conic radii of the four LED component types 46A, 46B, 46C, 46D. Thus, the corresponding four lighting units each produce light having a different spatial or angular light distribution.

Figure 5:
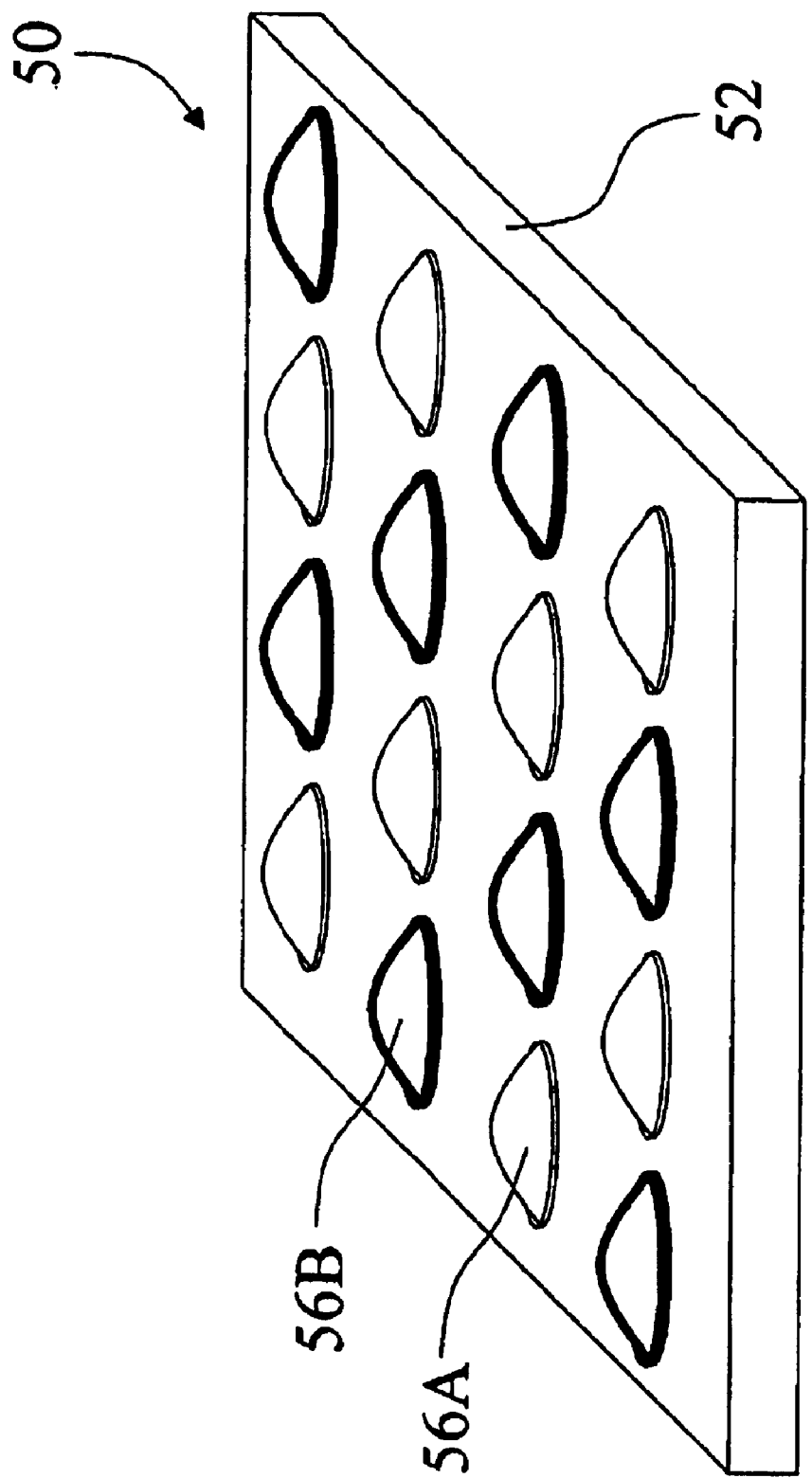
FIG. 5 shows a perspective view of a lamp or light source which suitably practices a third embodiment of the invention.

With reference now to FIG. 5, a third embodiment 50 of the invention is described. A rectangular substrate 52 has two lighting units corresponding to LED components of types 56A and 56B, respectively. The LED component types 56A, 56B have optical elements with essentially similar conic radii. However, different optical prescriptions are obtained by using materials having different refractive indexes for the optical elements of each component type 56A, 56B. Hence, the embodiment of FIG. 5 has a first angular or spatial light distribution obtained when the first optical source comprising the LED components of type 56A are activated; and a second angular or spatial light distribution obtained when the second optical source comprising the LED components of type 56B are activated. Optionally, a third angular or spatial light distribution can be obtained by activating both the first and the second optical sources together, the third angular or spatial distribution operatively combining the first and the second light output distributions.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A variable angular distribution lamp comprising:
   a substrate;
   a first lighting unit comprising:
      a first light emitting diode (LED) arranged on the substrate, and
      a first lens element having a first optical prescription, said first tens element being arranged to interact with light produced by the first LED to produce a first lamp illumination having a first angular distribution;
   a second lighting unit comprising:
      a second light emitting diode (LED) arranged on the substrate, and
      a second lens element having a second optical prescription different from the first optical prescription, said second lens element being arranged to interact with light produced by the second LED to produce a second lamp illumination having a second angular distribution that is different from the first angular distribution; and,
   a controller for energizing a selected one of the first lighting unit and the second lighting unit to produce a lamp illumination having a selected one of the first angular distribution and the second angular distribution, the controller including a first switch selectably operated to energize the first lighting unit and a second switch selectably operated to energize the second lighting unit.

2. The lamp as set forth in claim 1, wherein:
   light emitted from the first LED has a first spectral composition; and
   light emitted from the second LED has a second spectral composition different from the first spectral composition.

3. The lamp as set forth in claim 1, wherein:
   at least one of the first and second lens elements has a tinted region that alters a spectral composition of light emitted from the lighting unit including the tinted region.

4. The spot light as set forth in claim 1, wherein the substrate is a copper plate having a plurality of wells formed therein, each well containing one of the light emitting diodes and having the coupled lens disposed over the contained light emitting diode.

5. The spot light as set forth in claim 1, wherein the first and second lighting units each include a plurality of LEDs distributed essentially uniformly across the substrate.

6. The spot light as set forth in claim 1, wherein the first and second lighting units each include a plurality of LEDs, the arranged in concentric circles about the center of the substrate.

7. The spot light as set forth in claim 1, further including:
   a third lighting unit consisting of a single light emitting diode and optically coupled third lens element disposed at the center of the substrate.

8. A variable beam spot light including:

a substrate;

a first set of light emitting diodes disposed over the substrate;

a first set of lenses optically coupled to the first set of light emitting diodes, the lenses of the first set of lenses having a radius and refractive index that effects a first angular distribution of light produced by the first set of light emitting diodes;

a second set of light emitting diodes disposed over the substrate;

a second set of lenses optically coupled to the second set of tight emitting diodes, the lenses of the second set of lenses having a radius and refractive index that effects a second angular distribution of light produced by the second set of light emitting diodes, the second angular distribution being different from the first angular distribution, the light emitting diodes of the second set being interspersed amongst the light emitting diodes of the first set; and a control module that energizes a selected one of the first set of light emitting diodes and the second set of light emitting diodes to produce a spot light beam with a corresponding selected one of the first angular distribution and the second angular distribution.

9. The variable beam spot light as set forth in claim 8, wherein the control module includes:

a power input control that applies variable power energizing of the selected one of the first set of light emitting diodes and the second set of light emitting diodes to effect a variable intensity of the spot light beam.

10. The variable beam spot light as set forth in claim 9, wherein the power input control of the control module is one of a user-operable rheostat and a variable voltage divider.

11. The variable beam spot light as set forth in claim 8, wherein the control module includes:

a voltage divider that conditions voltage applied to one of the first set of light emitting diodes and the second set of light emitting diodes.

12. A variable beam spot light including:

a substrate;

a first set of light emitting diodes disposed over the substrate, the first set of light emitting diodes is being distributed substantially uniformly across the substrate;

a first set of lenses optically coupled to the first set of light emitting diodes, the lenses of the first set of lenses having a radius and refractive index that effects a first angular distribution of light produced by the first set of light emitting diodes;

a second set of light emitting diodes disposed over the substrate, the second set of light emitting diodes is being distributed substantially uniformly across the substrate, the light emitting diodes of the second set being interspersed amongst the light emitting diodes of the first sets a second set of lenses optically coupled to the second set of light emitting diodes, the lenses of the second set of lenses having a radius and refractive index that effects a second angular distribution of light produced by the second set of light emitting diodes, the second angular distribution being different from the first angular distribution; and a control module that energizes a selected one of the first set of light emitting diodes and the second set of light emitting diodes to produce a soot light beam with a corresponding selected one of the first angular distribution and the second angular distribution.

* * * * *